(12) United States Patent
Chauhan et al.

(10) Patent No.: US 11,184,015 B2
(45) Date of Patent: Nov. 23, 2021

(54) REFERENCE SIGNALS GENERATED USING INTERNAL LOADS

(71) Applicant: TEXAS INSTRUMENTS INCORPORATED, Dallas, TX (US)

(72) Inventors: Ankur Chauhan, Bangalore (IN); Abhrarup Barman Roy, Kolkata (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/873,758

(22) Filed: Jan. 17, 2018

(65) Prior Publication Data

US 2018/0262199 A1 Sep. 13, 2018

Related U.S. Application Data

(60) Provisional application No. 62/611,471, filed on Dec. 28, 2017.

(30) Foreign Application Priority Data

Mar. 10, 2017 (IN) .............................. 201741008402

(51) Int. Cl.
| | | |
|---|---|---|
| H03L 7/183 | (2006.01) | |
| H03K 5/1252 | (2006.01) | |
| H03K 5/24 | (2006.01) | |
| H03K 17/041 | (2006.01) | |
| H03M 1/46 | (2006.01) | |
| H03K 17/693 | (2006.01) | |
| H03K 19/0185 | (2006.01) | |
| H03M 1/74 | (2006.01) | |
| H03K 17/62 | (2006.01) | |

(52) U.S. Cl.
CPC .......... *H03L 7/183* (2013.01); *H03K 5/1252* (2013.01); *H03K 5/24* (2013.01); *H03K 17/04106* (2013.01); *H03K 17/62* (2013.01); *H03K 17/693* (2013.01); *H03K 19/0185* (2013.01); *H03M 1/46* (2013.01); *H03M 1/747* (2013.01)

(58) Field of Classification Search
CPC ....................................................... H03L 7/183
See application file for complete search history.

(56) References Cited

U.S. PATENT DOCUMENTS

2011/0001486 A1* 1/2011 Abouda ............... G01R 31/007
324/537

* cited by examiner

*Primary Examiner* — Daniel C Puentes
(74) *Attorney, Agent, or Firm* — Michelle F. Murray; Charles A. Brill; Frank D. Cimino

(57) ABSTRACT

In some examples, a device comprises a first driver coupled to a first node, the first node to couple to a first load external to the device. The device comprises a second driver coupled to a second node, the second node coupled to a second load internal to the device. The device comprises a comparison circuit having an inverting input coupled to the first node and a non-inverting input coupled to the second node. Sizes of the second driver and the second load are configured proportionately to sizes of the first driver and the first load, respectively.

23 Claims, 4 Drawing Sheets

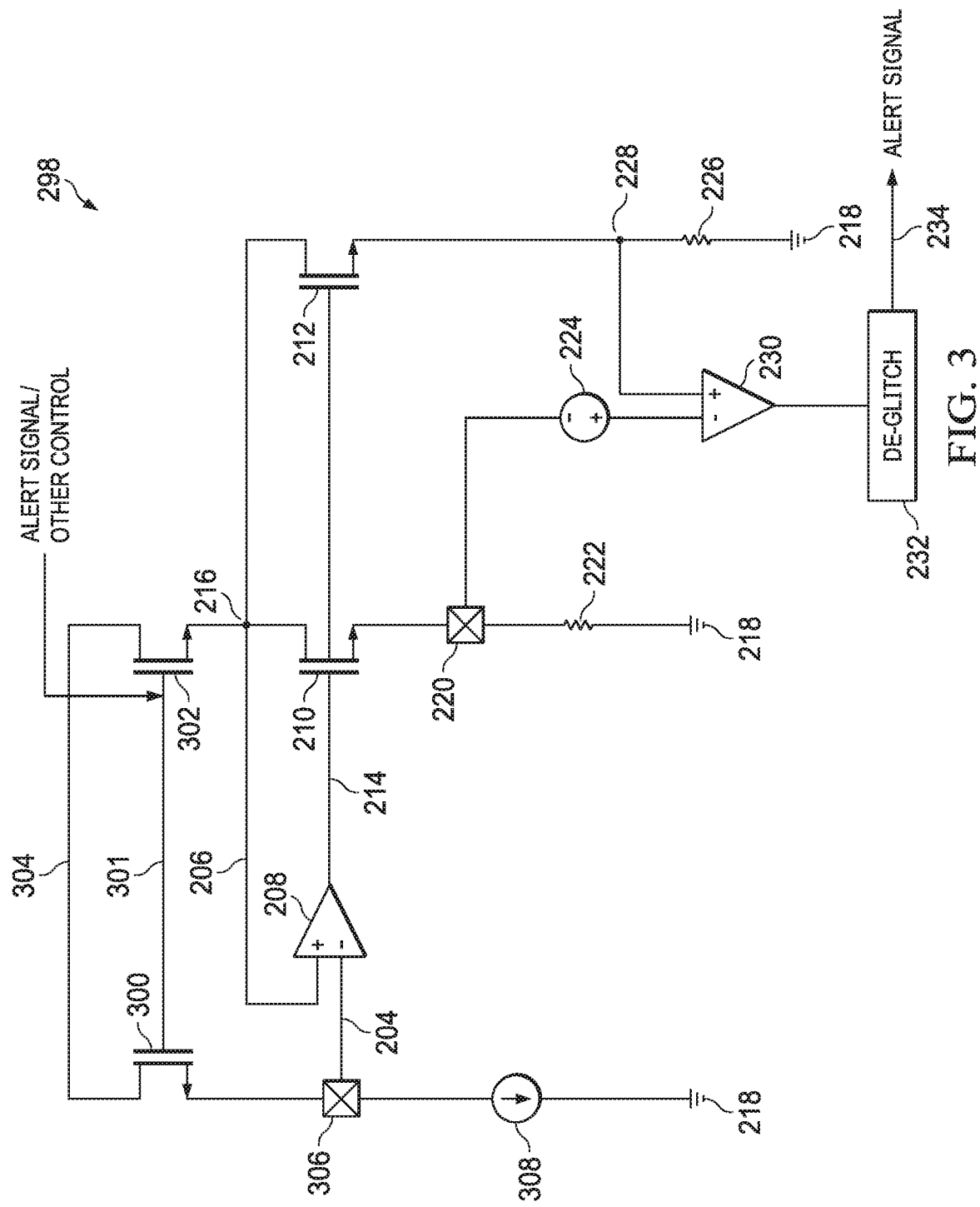

REFERENCE SIGNALS GENERATED USING INTERNAL LOADS

CROSS-REFERENCE TO RELATED APPLICATIONS

The present application claims priority to U.S. Provisional Patent Application No. 62/611,471, which was filed Dec. 28, 2017 and is titled "Reference Signals Generated Using Internal Loads," and to Indian Provisional Patent Application No. 201741008402, which was filed Mar. 10, 2017 and is titled "A Novel Pin Short Detect Scheme For Signal Output Pins." Both of the provisional applications are incorporated herein by reference in their entireties.

BACKGROUND

Integrated circuit (IC) packages typically include several pins by which the circuit can be connected to other electronic devices in an electronic system. For example, an IC package may include a processor and pins that facilitate connections between that processor and other electronic devices outside of the IC package, such as memory, antennas, audio processors, graphics cards, and the like. Some such IC pins are output pins that are used to drive loads external to the IC package.

SUMMARY

In some examples, a device comprises a first driver coupled to a first node, the first node to couple to a first load external to the device. The device comprises a second driver coupled to a second node, the second node coupled to a second load internal to the device. The device comprises a comparison circuit having an inverting input coupled to the first node and a non-inverting input coupled to the second node. Sizes of the second driver and the second load are configured proportionately to sizes of the first driver and the first load, respectively.

In some examples, a device comprises a first transistor having a terminal coupled to a first node, the first node to couple to a first load external to the device. The device comprises a second transistor having a terminal coupled to a second node, the second node coupled to a second load internal to the device. Gates of the first and second transistors couple to each other. The device includes a voltage offset circuit coupled to at least one of the first and second nodes. The device comprises a comparison circuit coupled to the voltage offset circuit and to one of the first and second nodes. The device comprises a de-glitch circuit coupled to an output of the comparison circuit.

In some examples, an integrated circuit (IC) package comprises a first field effect transistor (FET) coupled to a pin of the IC package; a load; a second FET coupled to the load via a node, the first and second FETs having common gate potentials; a comparison circuit having inputs coupled to the first and second FETs, at least one of the comparison circuit inputs having a voltage offset circuit coupled thereto; a de-glitch circuit coupled to an output of the comparison circuit; an amplifier having an output coupled to gates of the first and second FETs and having a first input coupled to non-gate terminals of the first and second FETs and having a second input; and third and fourth FETs having common gate potentials and having a pair of non-gate terminals coupled to each other, the third FET coupled to the second input of the amplifier and the fourth FET coupled to the first input of the amplifier.

BRIEF DESCRIPTION OF THE DRAWINGS

For a detailed description of various examples, reference will now be made to the accompanying drawings in which:

FIGS. 1-3 depict circuit schematic diagrams of integrated circuit (IC) devices in accordance with various examples.

DETAILED DESCRIPTION

As explained above, some IC pins are output pins that are used to drive loads external to the IC package. During normal operation, a sufficiently resistive load is present. However, it is possible for the pin to couple to a load that is insufficiently resistive or, in some cases, the pin may couple directly to ground. Such situations are termed "pin shorts." Pin shorts can occur for a variety of reasons, but when they do occur, they cause excessive current to flow through the IC pin. This can cause damage to the IC and to downstream components in addition to the IC. Further, even if no physical damage occurs, the fact that there is excess current or power in the IC pin can interfere with IC operation—for instance, when one or more operations of the IC is a function of the level of current flowing through that IC pin. Further still, certain certification standards, such as the UL 60950, require that certain current and power parameters be met in an IC pin when that pin experiences a pin short.

Described herein are various examples of an IC that quickly and reliably detects pin shorts and provides alert signals when pin shorts are detected. The alert signals are usable by other circuitry to take action to mitigate the damage and functionality compromise that would otherwise occur due to the pin shorts. At least some examples are directed to a device, such as an integrated circuit (IC), comprising a first driver coupled to a first node. The first node is to couple to a first load external to the device. The device also includes a second driver coupled to a second node. The second node is coupled to a second load internal to the device. The device further comprises a comparator coupled to the first and second nodes and configured to generate an alert signal in response to a voltage at the first node exceeding a voltage at the second node. The second driver and the second load are configured proportionately to the first driver and the first load, respectively, such that the voltage at the second node is within a predetermined range of the voltage at the first node during a non-short circuit condition at the first node. These and other examples are now described with respect to FIGS. 1-3.

Figure 1:
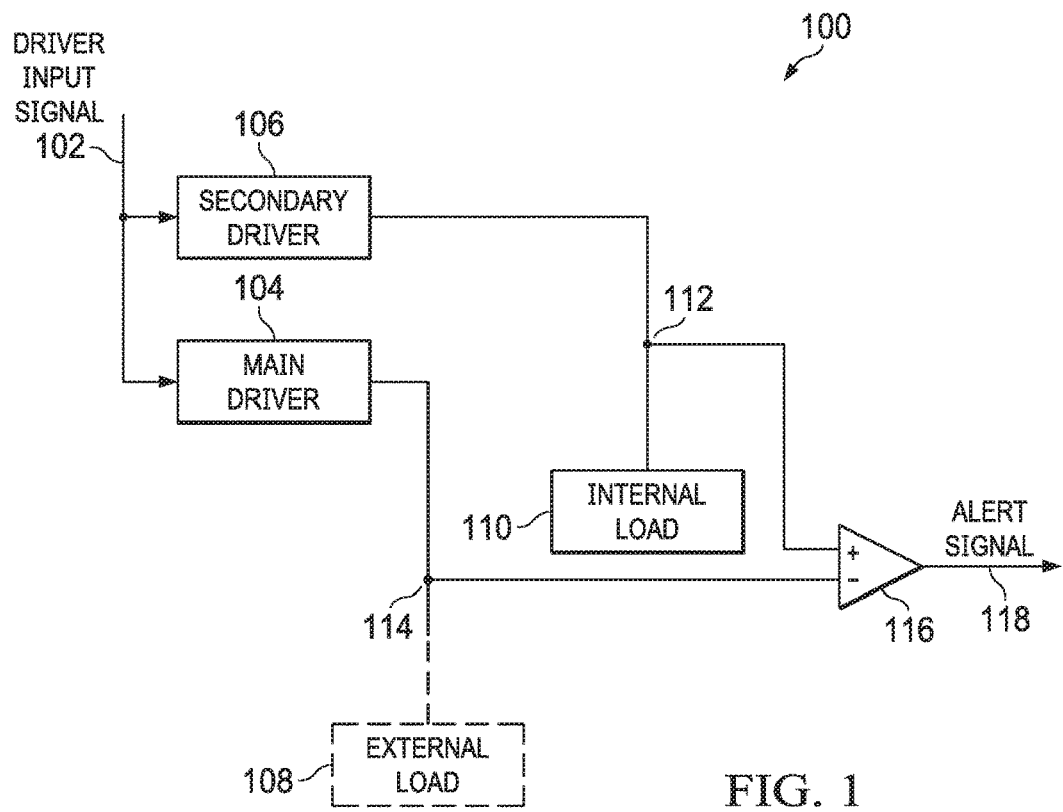

FIG. 1 depicts a circuit schematic diagram of an integrated circuit (IC) device 100 in accordance with various examples. The device 100 comprises a driver input signal 102; a main driver 104; a secondary driver 106; a node 112; a node 114; an internal load 110; and a comparator 116 that outputs an alert signal 118. In some examples, the IC device 100 includes other components that are not expressly depicted in FIG. 1. For instance, in some examples, the IC device 100 may include a circuit to apply a voltage offset to the node 114, such as the circuit depicted in FIG. 4. In some examples, the IC device 100 may include a circuit to apply a voltage offset to the node 112. Such voltage offsets are usable to mitigate error introduced by various circuit components. For example, the main driver 104 and the secondary driver 106, as well as the comparator 116, may introduce a finite, quantifiable voltage error at the inverting input to the comparator 116. The type of voltage error can negatively impact the comparison performed by the comparator 116, since the error skews one or more of the inputs to the comparator 116. Accordingly, a circuit, such as that depicted in FIG. 4 and described below, can be used to introduce a voltage bias at the inverting input (and/or at the non-inverting input to the comparator 116, as necessary) that compensates for the error by providing a voltage that is equal or approximately equal to that of the error but that is opposite in polarity. In some examples, the IC device 100 may include a de-glitch circuit at the output of the comparator 116 that provides a time delay to the output of the comparator 116 to account for temporal voltage fluctuations at the nodes 112, 114. In some examples, the IC device 100 may include circuitry that produces the driver input signal 102. In some examples, the IC device 100 comprises an IC package with multiple pins, with the node 114 being coupled to one of such pins. Also depicted in FIG. 1, but not included as part of the IC device 100, is an external load 108.

The main driver 104 includes circuitry that is configured to drive (e.g., provide current to) the external load 108 via the node 114. The external load 108 may be any suitable type of load, including a resistor, a capacitor, an inductor, or any other load. When the main driver 104 supplies current to the external load 108, a voltage forms at the node 114, which is provided to an input (e.g., the inverting input) of the comparator 116.

In some examples, the secondary driver 106 includes circuitry configured to drive the internal load 110 via node 112. As with the external load 108, the internal load 110 may be any suitable type of load, including a resistor, a capacitor, an inductor, or any other load that provides the same impedance as the external load 108. When the secondary driver 106 drives the internal load 110, a voltage forms at the node 112. This voltage at the node 112 is also provided to an input (e.g., the non-inverting input) of the comparator 116. In some examples, the voltage at the node 112 is provided to a non-inverting input of the comparator 116, while the voltage at the node 114 is provided to an inverting input of the comparator 116. In other examples, the voltage at the node 112 is provided to an inverting input of the comparator 116, while the voltage at the node 114 is provided to a non-inverting input of the comparator 116. The driver input signal 102, which is provided to both the drivers 104 and 106, depends on the context or application in which the IC device 100 is implemented. For example, the IC device 100 may be implemented in, or may include, a current limiting circuit, as described below with respect to FIG. 3.

In at least some instances, the impedance of the external load 108 is known when the IC device 100 is being designed or manufactured. Accordingly, the impedance of the external load 108 may be used when configuring the drivers 104, 106 and the internal load 110. For instance, in some examples the secondary driver 106 and the internal load 110 are identical to the main driver 104 and the external load 108—that is, the drivers and loads are replicas of each other. In this way, the secondary driver 106 and internal load 110 produce a reference voltage at the node 112 for the comparator 116 that indicates the voltage expected at the node 114 under normal (i.e., non-short circuit) operating conditions. In some examples, the secondary driver 106 and the internal load 110 are scaled-down versions of the main driver 104 and the external load 108, but they are scaled proportionately so that, under normal (i.e., non-short) conditions, the voltages at the nodes 112, 114 are approximately equal. Again, in this manner, the secondary driver 106 and the internal load 110 produce a reference voltage for use by the comparator 116 in monitoring for short-circuit conditions at the node 114. (The term "approximately," as used herein, means within plus or minus 15% of the stated value. Thus, for a first voltage to be approximately equal to a second voltage, either the first voltage is within plus or minus 15% of the second voltage, or the second voltage is within plus or minus 15% of the first voltage.) In some examples, the secondary driver 106 and internal load 110 are configured such that the voltage at node 112 is a desired reference voltage that is different than the voltage expected at node 114 under normal operating conditions—for instance, if a designer wishes to allow some degree of variation in the voltage at node 114 without triggering the alert signal 118. In at least some of the foregoing examples, the drivers 104, 106 include transistors (e.g., field effect transistors (FETs, GaN devices, etc.), metal oxide semiconductor FETs) that have a sizing ratio that is proportional to the impedance ratio of the external and internal loads 108, 110.

In operation, the secondary driver 106 and the internal load 110 mimic the main driver 104 and the external load 108 so that, under normal conditions, the voltage produced at node 112 is approximately equal to the voltage at node 114 or is within a predetermined range below the voltage at node 114. In this way, the voltage at node 112 is used as a reference signal by the comparator 116 as the comparator 116 monitors the voltage at node 114 for short circuit conditions. So long as the node 114 does not experience short-circuit conditions (or a significant drop in impedance), the comparator 116 determines the voltage at node 112 to be lower than the voltage at node 114, and the alert signal 118 remains in a deasserted state. If and when the node 114 encounters a short circuit condition (or, instead of a short circuit condition, a significant drop in impedance), the voltage at node 112 will exceed the voltage at the node 114, thus causing the comparator 116 to output an asserted alert signal 118. Other components of the IC device 100, or a device other than the IC device 100, uses the alert signal 118 to take mitigating action to prevent damage or functional compromise as a result of the short circuit (or lowered impedance) condition at the node 114.

Figure 2:
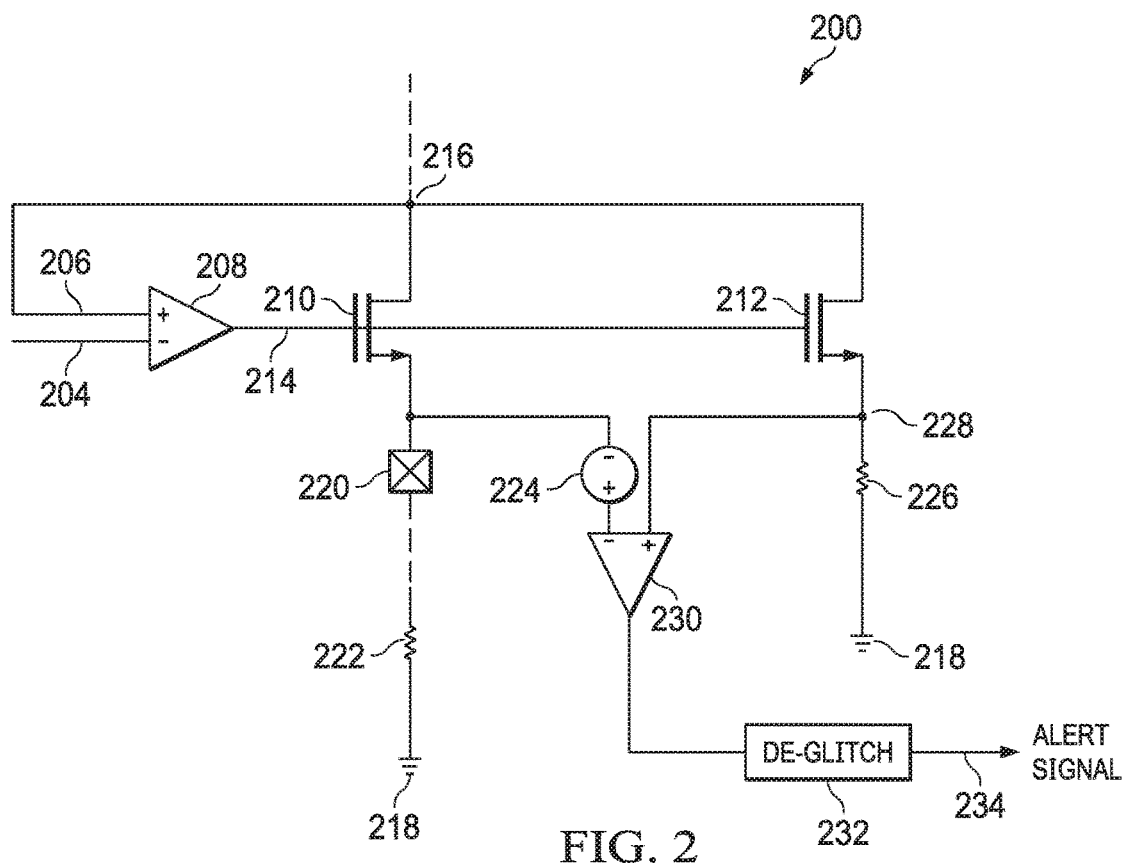

FIG. 2 depicts a circuit schematic diagram of an integrated circuit (IC) device 200 in accordance with various examples. The IC device 200 is an illustrative example of the more generic IC device 100 depicted in FIG. 1, and it does not limit the scope of possible examples of the IC device 100 of FIG. 1. In some examples, the IC device 200 includes an amplifier 208 that receives a control signal 204 and a feedback signal 206. The IC device 200 includes a transistor 210 (e.g., a field effect transistor (FET), a metal oxide semiconductor field effect transistor (MOSFET), a GaN device, etc.). The transistor 210 of FIG. 2 corresponds to the main driver 104 of FIG. 1. In FIG. 2, transistor 210 is depicted as being an n-type MOSFET. The IC device 200 also includes a transistor 212 (e.g., a FET, MOSFET, GaN device, etc.). The transistor 212 of FIG. 2 corresponds to the secondary driver 106 of FIG. 1. In FIG. 2, transistor 212 is depicted as being an n-type MOSFET. In some examples, the gates of the transistors 210, 212 are tied together and couple to an output 214 of the amplifier 208. Similarly, the drains of the transistors 210, 212 are tied together at node 216 and are further provided to an input (i.e., feedback signal) 206 of the amplifier 208. The node 216 couples to a power supply rail (not specifically shown). A source of the transistor 210 couples to node 220, which corresponds to node 114 in FIG. 1. A source of the transistor 212 couples to node 228, which corresponds to node 112 in FIG. 1. Node 220 couples to a voltage offset circuit 224 (e.g., a voltage source such as that depicted in FIG. 4), which, in turn, couples to an input of the comparator 230. As described above, such voltage offset circuits provide a bias that negates the voltage error introduced by one or more circuit components, such as the transistor 210, the transistor 212, and/or the comparator 230. The node 228 couples to an internal load 226, which, in turn, couples to ground 218. The node 228 couples to another input of the comparator 230. In some examples, the voltage offset circuit 224 is applied to the node 228 instead of the node 220. In some examples, the voltage applied by the voltage offset circuit 224 is approximately 20 mV. An output of the comparator 230 couples to a de-glitch circuit 232 (e.g., TEXAS INSTRUMENTS® TPS2595). An alert signal 234 is produced by the de-glitch circuit 232. FIG. 2 also depicts an external load 222 that is external to the IC device 200. The external load 222 couples to ground 218 and to node 220. In some examples, node 220 is on an IC package pin.

The transistors 210, 212 and the impedance value of the internal load 226 are selected in such a way that a desired reference voltage is produced at the node 228 based on the expected voltage at node 220 under normal operating conditions. The expected voltage at node 220 is based at least in part on the impedance of the external load 222. As explained above, in some examples, the sizing ratio of the transistors 210, 212 and the impedance ratio of the loads 222, 226 are configured so that the reference voltage produced at node 228 is equal to an expected voltage at node 220 under normal operating conditions. In some examples, those parameters are configured so that the reference voltage at node 228 is less than the expected voltage at node 220 under normal operating conditions, but is still within an acceptable limit below the voltage at which short circuit conditions would be suspected at node 220. In some examples, the aspect ratio of the transistor 212 is 1/200 the aspect ratio of the transistor 210.

Figure 5:
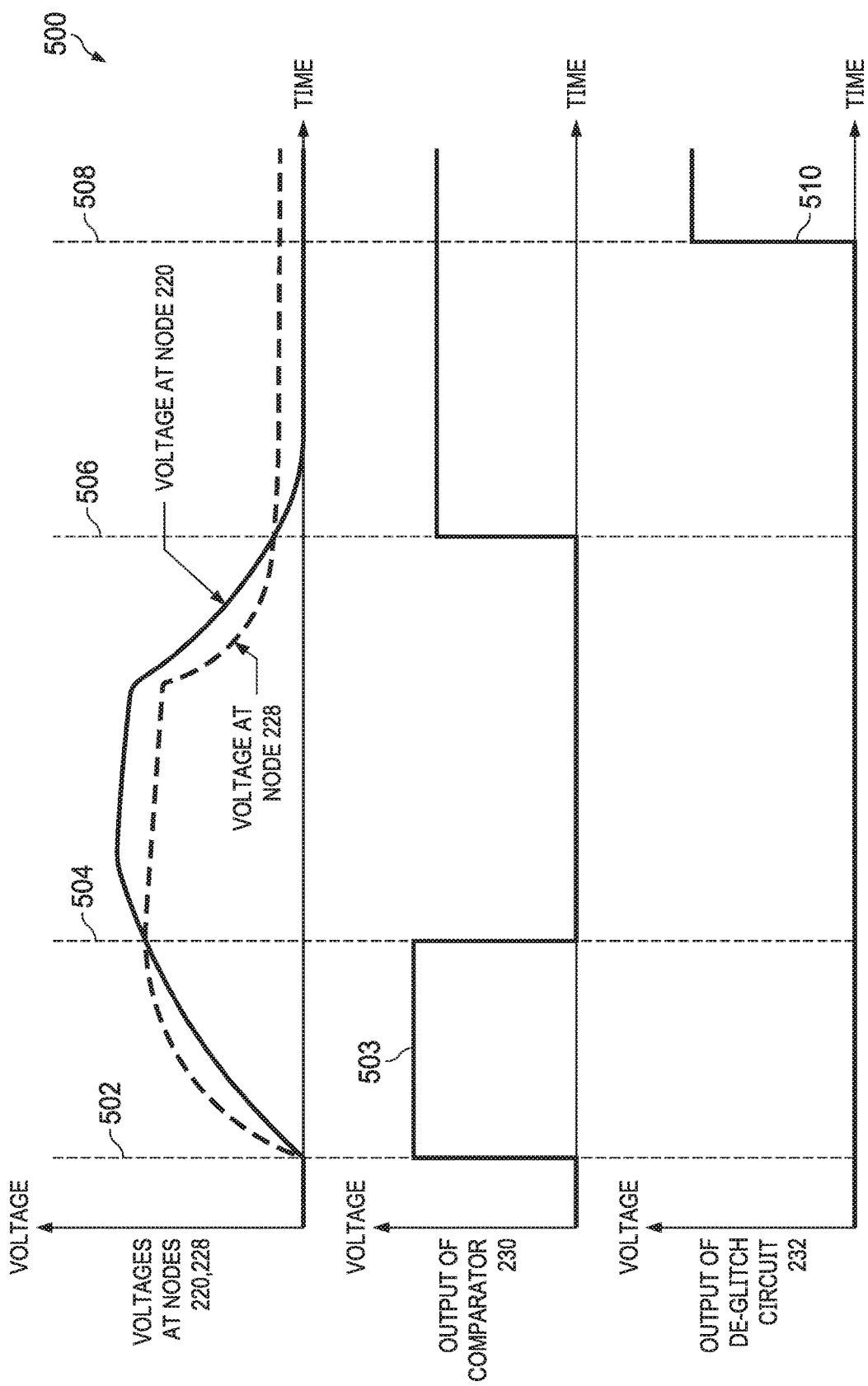
FIG. 5 depicts an illustrative timing diagram showing the voltages present at various points in an integrated circuit device, in accordance with various examples.

In operation, the amplifier 208 drives the gates of the transistors 210, 212 based on the control signal 204 and the feedback loop at input 206. The control signal 204 may be generated by any suitable circuitry within or external to the IC device 200. The voltage applied at the gate of transistor 210 controls current flow from the supply rail at node 216 toward the node 220 and the external load 222. At a smaller scale (or, in some examples, at the same scale), the voltage applied at the gate of transistor 212 controls current flow to the internal load 226 via node 228. These current flows produce voltages at the nodes 220, 228. The voltage at node 220, combined with the voltage applied by the voltage offset circuit 224, is provided to the comparator 230, and the voltage at node 228 is also provided to the comparator 230. During normal operation, the comparator 230 outputs an alert signal 234 (temporally-compensated by the de-glitch circuit 232) that indicates no short circuit conditions at the node 220. However, if the comparator 230 determines that the voltage at the node 220 meets and/or is below the voltage at node 228, the comparator 230 outputs an alert signal 234 (temporally compensated by the de-glitch circuit 232) that indicates a short circuit condition at the node 220. Other device or system components are flagged by the alert signal 234 and take remedial action. Remedial actions may include, for instance, shutting off the device 200 until the device 200 is manually re-started, shutting off the device 200 for a predetermined period of time and then automatically re-starting the device 200, or shutting off the device 200 and switching on another device that can substitute for the device 200. Other remedial actions are possible and are contemplated. FIG. 5, described below, is a timing diagram that depicts operation of the device 200.

FIG. 3 depicts a circuit schematic diagram of a current-limiting integrated circuit (IC) device 298 in accordance with various examples. More specifically, the IC device 298 is similar to the IC device 200 of FIG. 2 but depicts additional components that are not depicted in FIG. 2. These additional components provide one context or application in which the IC devices of FIGS. 1 and 2 may be deployed.

In addition to the components of the IC device 200, which are not again described here, the IC device 298 includes a transistor 300 (e.g., a FET, a MOSFET, etc.), which, in this figure, is depicted as an N-type MOSFET; a transistor 302 (e.g., a FET, a MOSFET, etc.), which, in this figure, is depicted as an n-type MOSFET; a power supply rail node 304 tying the drains of the transistors 300, 302 together; a connection 301 tying the gates of the transistors 300, 302 together; a node 306 coupling to the input (i.e., control signal) 204 of the amplifier 208; and an external load, such as a current source 308, coupled to ground 218.

In operation, current flows from the power supply rail at node 304 toward the transistor 300 and to the current source 308. Transistor 302 mirrors the current through transistor 300, and this mirrored current through transistor 302 is provided to the transistors 210, 212. The mirroring is achieved by the amplifier 208, which maintains a common voltage potential at inputs 204 and 206, which are the source nodes of transistors 302 and 300, respectively. A control signal coupled to the connection 301 controls the gate signals applied to the transistors 300, 302. Because the gates of the transistors 300, 302 are tied and because the sources of the transistors 300, 302 are controlled to be the same by the amplifier 208, the transistors 300, 302 turn on and off at the same times, assuming the same threshold voltages. The transistors 300, 302 are sized differently, however, and so the current (i.e., a "sense" current) flowing through the transistor 302 is a fraction of the current flowing through the transistor 300 when the transistors are on. The sense current flowing through the transistor 302 and transistor 210 flows through the external load 222 (which, in some examples, is a programmable load) to generate a voltage at node 220 (which is usable for various functions, such as to control the transistors 300, 302). The voltage at the node 228 serves as a reference voltage, and so the comparator 230 compares the voltage at node 220 to the voltage at node 228 and produces an asserted or deasserted alert signal 234 based on the results of the comparison. In some examples, the alert signal 234 couples to the gates of the transistors 300, 302. In this manner, the comparator 230 controls the switching activity of the transistors 300, 302, causing the currents flowing through the two transistors 300, 302 to remain stable. The current limit of the IC device 298 may be defined as:

$$\text{Current through transistor } 300 = \frac{\text{Reference voltage at node } 220}{\text{Impedance of external load } 222} * K,$$

where K is a sizing ratio between the transistors 300, 302. As long as the impedance of the external load 222 remains fixed, the limit of the current through the transistor 300 will remain stable. However, if a short circuit condition appears at node 220, the current limit of the current through the transistor 300 could experience a proportionate increase. For a true short circuit condition at node 220, the current limit could essentially disappear. However, because the alert signal 234 would be asserted in such a scenario, circuitry designed to mitigate damage and functional compromise due to a short circuit condition at node 220 would take remedial action, thus mitigating the instability described above.

Figure 4:
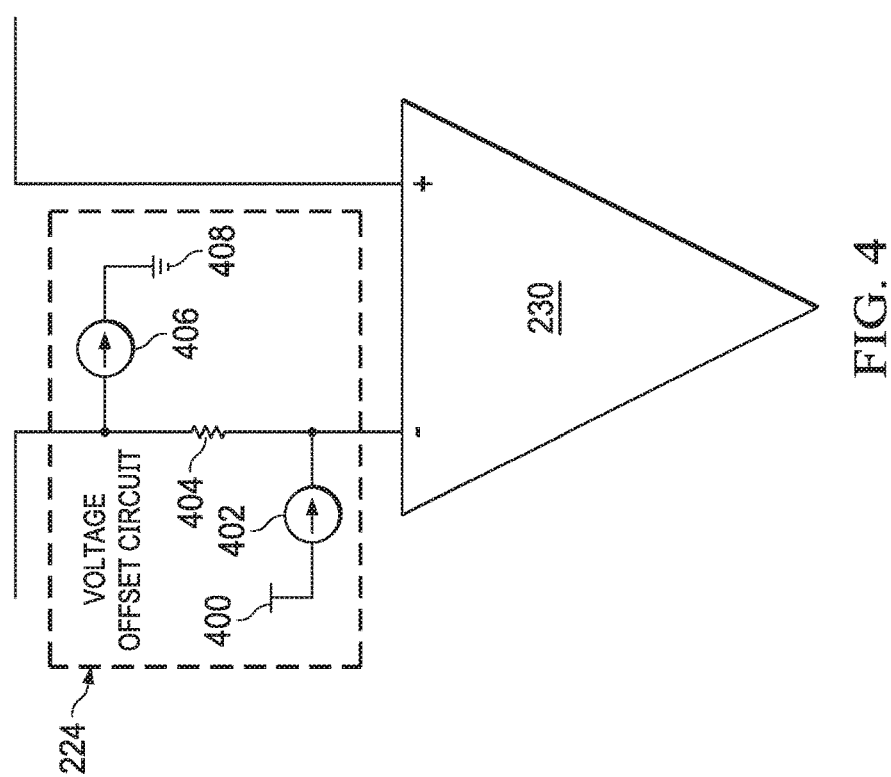
FIG. 4 depicts an illustrative voltage offset circuit in accordance with various examples.

FIG. 4 depicts an illustrative voltage offset circuit 224 in accordance with various examples. In FIG. 4, the voltage offset circuit 224 is positioned at the inverting input of the comparator 230, but in some examples, the voltage offset circuit 224 may be positioned on the non-inverting input of the comparator 230. In some examples, the polarity of the voltage provided by the voltage offset circuit 230 may be altered as desired. The voltage offset circuit 224 may include a resistor 404 that couples to a current source 402 and a current source 406. In some examples, the current sources 402 and 406 may provide equal currents that flow in the same direction. The current source 402 couples to a power supply rail 400 (e.g., the power supply rail 304 depicted in FIG. 3). The current source 406 couples to ground 408. The current sources 402 and 406 provide a current through the resistance 404, which would otherwise not carry a current because the inputs to the comparator 230 are high-impedance inputs. Forcing a current through the resistor 404 in this manner produces a voltage drop across the resistor 404, which offsets the voltage error described above. Because the voltage error is finite and quantifiable, the voltage offset circuit 224 may be designed and implemented at the time that the IC device containing the voltage offset circuit 224 is manufactured.

FIG. 5 depicts a timing diagram 500 showing the voltages present at various points in the IC devices described herein (e.g., the devices 200 and 298). The timing diagram 500 plots time on the x-axis and voltage on the y-axis. The timing diagram 500 includes three plots: the top plot, which depicts voltages at nodes 220 (solid line) and 228 (dashed line) (FIGS. 2 and 3); the middle plot, which depicts the output of the comparator 230; and the bottom plot, which depicts the output of the de-glitch circuit 232. At time 502, the IC device is powered on, and the voltages at nodes 220, 228 begin rising. Between times 502 and 504, the voltage at node 220 rises faster than the voltage at node 228. After point 504, the voltage at node 220 settles at a level that is higher than the voltage at node 228. Because the voltage at node 220 is lower than the voltage at node 228 during the period between times 502 and 504, the output of the comparator 230 will indicate a short circuit condition, as shown by the pulse 503 in the middle plot. However, as explained above, this does not represent a true short circuit condition, and so the pulse 503 is a glitch that is filtered by the de-glitch circuit 232 to produce an output that is flat, as shown in the bottom plot. Later, at time 506, the voltage at node 220 drops below the voltage at node 228. As a result, the output of the comparator 230 again rises. This time, however, a true short circuit condition is present. Thus, after a time delay between times 506 and 508, the de-glitch circuit 232 outputs a high signal as indicated by numeral 510. This output may be used by circuitry downstream from the de-glitch circuit 232 as desired, as explained above.

Figure 6:
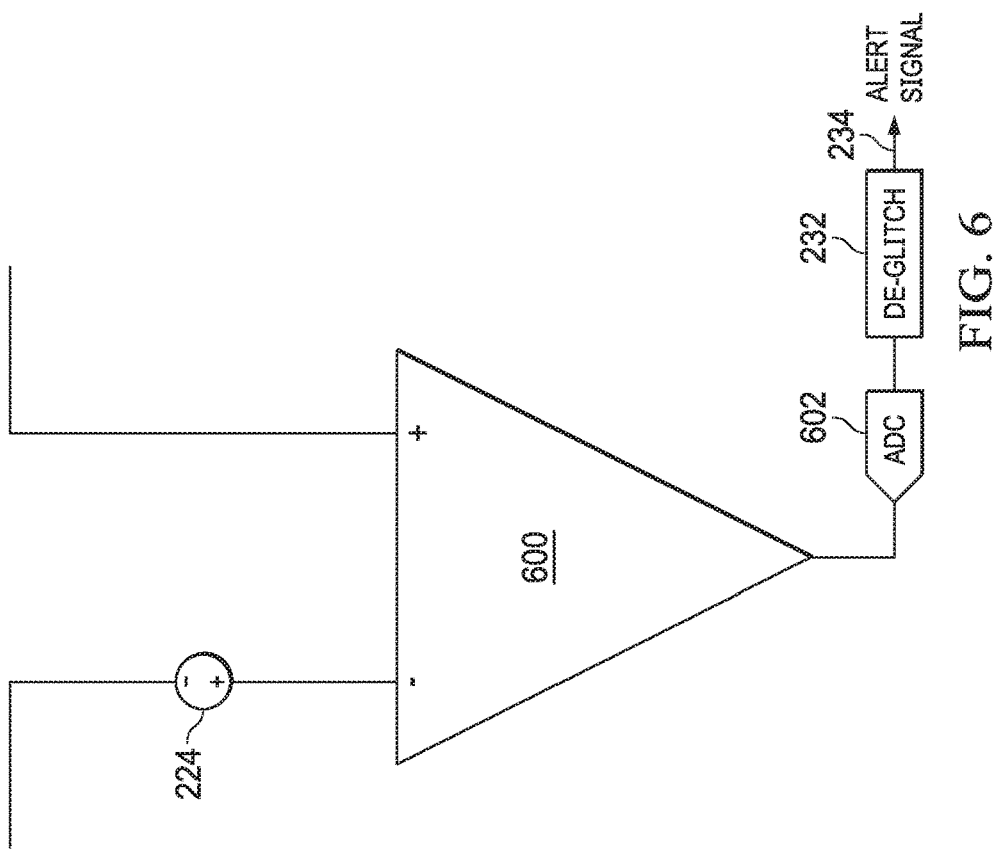
FIG. 6 depicts an illustrative amplifier-analog-to-digital-converter (ADC) combination circuit in accordance with various examples.

FIG. 6 depicts an illustrative amplifier-ADC combination circuit in accordance with various examples. The amplifier-ADC combination circuit may be used in lieu of the comparators 116 and 230 of FIGS. 1-3. The circuit of FIG. 6 includes an amplifier 600 that receives input signals that indicate the voltages across the internal and external loads—e.g., the voltages at nodes 112 and 114 in FIG. 1 and at nodes 220 and 228 in FIGS. 2 and 3. A voltage offset circuit 224 may be present on one of the inputs to the amplifier 600. The amplifier output is an analog signal that is provided to an ADC 602, which may quantize the analog signal to produce a digital signal that is subsequently provided to the de-glitch circuit 232. The de-glitch circuit 232 then processes the signal from the ADC 602 as it would process signals from, e.g., the comparator 230. The term "comparison circuit" may be used to describe the comparator 116, the comparator 230, and the amplifier 600-ADC 602 combination circuit of FIG. 6.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device comprising:
    a first transistor having a first current terminal, a second current terminal, and a first control terminal;
    a second transistor having a third current terminal, a fourth current terminal, and a second control terminal, the second control terminal coupled to the first control terminal and the first current terminal coupled to the third current terminal;
    an amplifier having a first amplifier input, a second amplifier input, and an amplifier output, the first amplifier input coupled to the first current terminal and the amplifier output coupled to the first control terminal; and
    a comparison circuit having an inverting input and a non-inverting input, the inverting input coupled to the second current terminal and the non-inverting input coupled to the fourth current terminal.

2. The device of claim 1, further comprising a voltage offset circuit coupled to the second current terminal.

3. The device of claim 1, further comprising a de-glitch circuit coupled to an output of the comparison circuit.

4. The device of claim 1, wherein the second current terminal is adapted to be coupled to a first load, the fourth current terminal is coupled to a second load, and a sizing ratio between the first and second transistors is inversely proportional to an impedance ratio between the first and second loads.

5. The device of claim 4, wherein sizes of the second transistor and the second load are configured proportionately to sizes of the first transistor and the first load, respectively.

6. The device of claim 1, further comprising a third transistor having a fifth current terminal, a sixth current terminal, and a third control terminal, the sixth current terminal coupled to the second amplifier input.

7. The device of claim 6, further comprising a fourth transistor having a seventh current terminal, an eighth current terminal, and a fourth control terminal, the seventh current terminal coupled to the fifth current terminal, the eighth current terminal coupled to the first current terminal, and the fourth control terminal coupled to the third control terminal.

8. The device of claim 7, further comprising a power supply rail coupled to the fifth current terminal and the seventh current terminal.

9. The device of claim 1, wherein the device includes an IC package and wherein the second current terminal is coupled to a pin of the IC package.

10. A device comprising:
a first transistor having a first current terminal, a second current terminal, and a first control terminal, the second current terminal coupled to a first node;
a second transistor having a third current terminal, a fourth current terminal, and a second control terminal, the fourth current terminal coupled to a second node, wherein the second control terminal is coupled to the first control terminal;
an amplifier having a first amplifier input, a second amplifier input, and an amplifier output, the first amplifier input coupled to the first current terminal and the amplifier output coupled to the first control terminal;
a voltage offset circuit coupled to at least one of the first and second nodes;
a comparison circuit coupled to the voltage offset circuit and to one of the first and second nodes; and
a de-glitch circuit coupled to a comparison output.

11. The device of claim 10, further comprising a third transistor having a fifth current terminal, a sixth current terminal, and a third control terminal, the sixth current terminal coupled to the second amplifier input.

12. The device of claim 11, further comprising a fourth transistor having a seventh current terminal, an eighth current terminal, and a fourth control terminal, the fourth control terminal coupled to the third control terminal and the seventh current terminal coupled to the fifth current terminal.

13. The device of claim 10, wherein the de-glitch circuit is configured to provide a time delay of the comparison output of at least 50 microseconds.

14. The device of claim 10, wherein the second current terminal is adapted to be coupled to a first load, the fourth current terminal is coupled to a second load, and an impedance ratio of the first and second loads is inversely proportional to a sizing ratio of the first and second transistors.

15. The device of claim 10, wherein the device comprises an integrated circuit (IC) package and wherein the first node is on a pin of the IC package.

16. An integrated circuit (IC), comprising:
a first field effect transistor (FET) having a first drain, a first source, and a first gate, the first source coupled to a pin of the IC;
a load;
a second FET having a second drain, a second source, and a second gate, the second source coupled to the load the second gate coupled to the first gate;
a comparison circuit having a first comparison input, a second comparison input, and a comparison output, the first comparison input coupled to the first source and the second comparison input coupled to the second source, a voltage offset circuit coupled thereto the first comparison input or to the second comparison input;
a de-glitch circuit coupled to the comparison output;
an amplifier having a first amplifier input, a second amplifier input, and an amplifier output, the amplifier output coupled to the first gate, and the first amplifier input coupled to the first drain and to the second drain;
a third FET having a third drain, a third source, and a third gate, the third source coupled to the second amplifier input; and
a fourth FET having a fourth drain, a fourth source, and a fourth gate, the fourth gate coupled to the third gate.

17. The IC of claim 16, wherein the third drain is coupled to the fourth drain.

18. The IC of claim 16, wherein the first drain is coupled to the second drain.

19. The IC of claim 16, wherein the pin is adapted to couple to another load external to the IC, and wherein an impedance ratio of the load and the another load is inversely proportional to a sizing ratio of the first and second FETs.

20. The IC of claim 16, wherein the first, second, third and fourth FETs are n-type metal oxide semiconductor field effect transistors (MOSFETs).

21. A device comprising:
a first driver coupled to a first node, the first node adapted to be coupled to a first load external to the device;
a second driver coupled to a second node, the second node coupled to a second load internal to the device; and
an amplifier coupled to the first node, to the second node, and to an analog-to-digital converter, the amplifier configured to produce an alert signal in response to a voltage at the first node dropping below a voltage at the second node.

22. The device of claim 21, further comprising a voltage offset circuit coupled to the amplifier, the voltage offset circuit comprising a resistor coupled to one or more current sources.

23. The device of claim 21, wherein the second driver and the second load are configured proportionately to the first driver and the first load, respectively, such that the voltage at the second node is within a predetermined range of the voltage at the first node during a non-short circuit condition at the first node.

* * * * *